(12) United States Patent
Hartz et al.

(10) Patent No.: US 11,393,542 B2
(45) Date of Patent: Jul. 19, 2022

(54) REDUCED-VOLTAGE OPERATION OF A MEMORY DEVICE

(71) Applicant: Micron Technology, Inc., Boise, ID (US)

(72) Inventors: Ezra E. Hartz, Meridian, ID (US); Vipul Patel, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 107 days.

(21) Appl. No.: 17/065,359

(22) Filed: Oct. 7, 2020

(65) Prior Publication Data

US 2022/0108755 A1    Apr. 7, 2022

(51) Int. Cl.
*G11C 7/00*     (2006.01)
*G11C 16/34*    (2006.01)
*G11C 16/26*    (2006.01)
*G11C 16/10*    (2006.01)
*G11C 16/30*    (2006.01)

(52) U.S. Cl.
CPC .......... *G11C 16/3404* (2013.01); *G11C 16/10* (2013.01); *G11C 16/26* (2013.01); *G11C 16/30* (2013.01)

(58) Field of Classification Search
CPC ....... G11C 5/147; G11C 5/14; G11C 11/4074; G11C 11/417; G11C 7/22
USPC .................................................. 365/226, 227
See application file for complete search history.

(56) References Cited

U.S. PATENT DOCUMENTS 9,461,562 B1* 10/2016 Johal .................. G06F 1/32
9,471,120 B1* 10/2016 Thakur ............... G06F 1/24

* cited by examiner

*Primary Examiner* — Son T Dinh
(74) *Attorney, Agent, or Firm* — Holland & Hart LLP

(57) ABSTRACT

Methods, systems, and devices for reduced-voltage operation of a memory device are described. A memory device may operate in different operational modes based on a value of a supply voltage fir the memory device. For example, when the value of the supply voltage exceeds both a first threshold voltage and a second threshold voltage, the memory device may be operated in a normal operation mode. When the value of the supply voltage is between the first threshold voltage and the second threshold voltage, the memory device may be operated in a low voltage operation mode, which may be a reduced performance mode relative to the normal operation mode. When the value of the supply voltage is below the second threshold voltage, the memory device may be deactivated.

25 Claims, 8 Drawing Sheets

REDUCED-VOLTAGE OPERATION OF A MEMORY DEVICE

BACKGROUND

The following relates generally to one or more memory systems and more specifically to reduced-voltage operation of a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
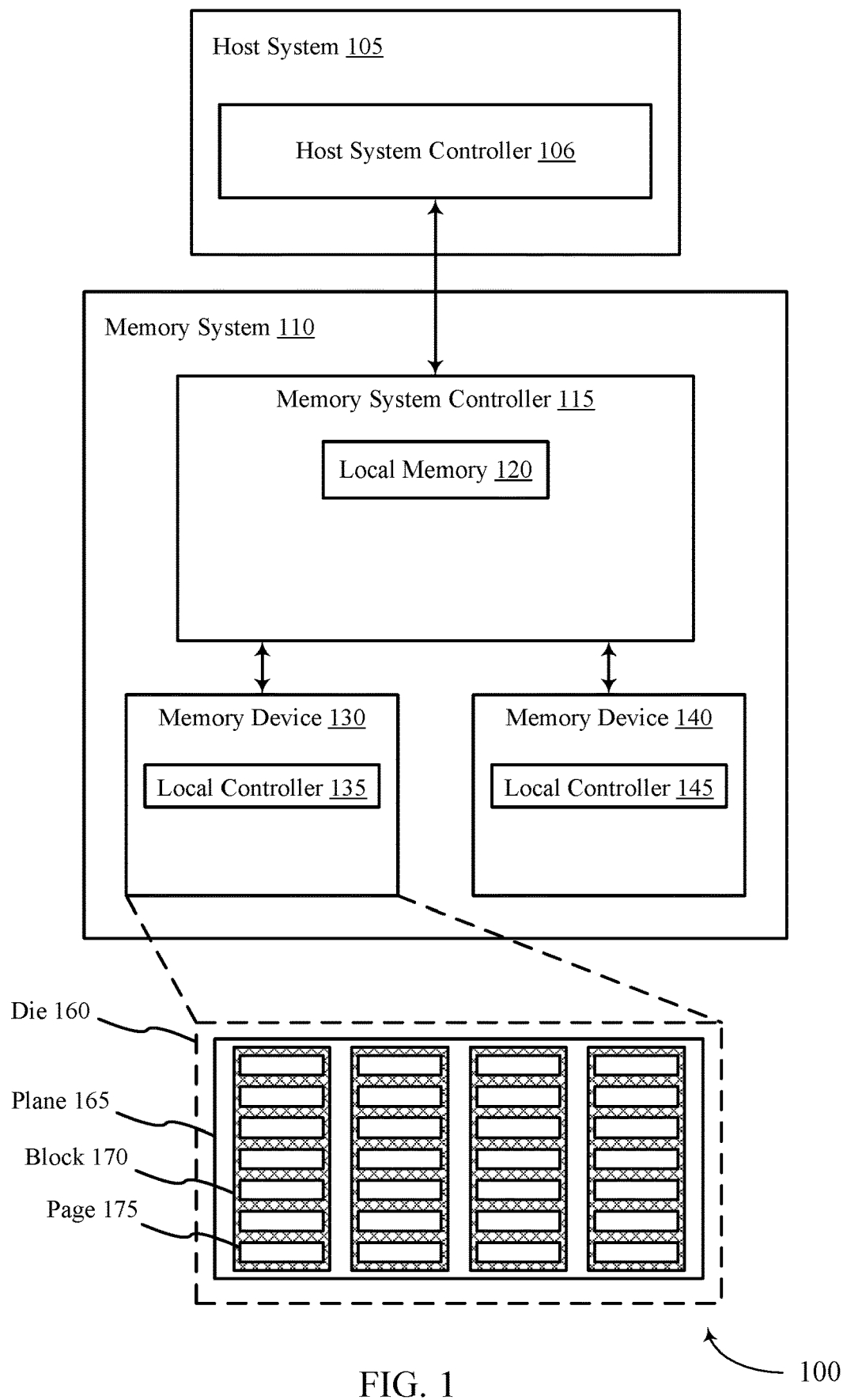
FIG. 1 illustrates an example of a system that supports reduced-voltage operation of a memory device in accordance with examples as disclosed herein.

A memory device may be configured to operate using a supply voltage that is within a range of supported voltage values. For example, one or more memory dies, or any quantity of components thereof, may be powered by the supply voltage either directly or indirectly (e.g., powered by a voltage generated using the supply voltage). If the supply voltage is outside the supported range, the memory device may be unable to operate, at least in accordance with one or more reliability or performance criteria.

Some memory devices may be deactivated (e.g., autonomously) if a supply voltage drops for the memory device below a threshold voltage, which may be referred to as a deactivation threshold or reset threshold. When the memory device becomes deactivated due to a drop in supply voltage, a system that includes the memory device may experience delays or otherwise have its performance adversely affected. For example, the system may have to reactivate (e.g., reinitialize) the memory device, one or more operations by the memory device have to be repeated, or both, among other possible drawbacks.

As described herein, an additional voltage threshold may be introduced for a memory device, which may be referred to as a low voltage operation threshold and may be greater than the deactivation threshold for the memory device. When the supply voltage for the memory device is above both the deactivation threshold and the low voltage operation threshold, the memory device may operate as normal (e.g., in a normal operation mode). When the supply voltage for the memory device drops below the low voltage operation threshold, rather than being deactivated, the memory device may enter a low voltage operation mode. The low voltage operation mode may correspond to a reduced performance mode. For example, when operating in the low voltage operation mode, the memory device may support a reduced quantity of concurrent (e.g. parallel) operations per memory die or across multiple memory dies.

Operating the memory device in a low voltage operation mode may be preferable to the memory device becoming deactivated. And in at least some cases, operating the memory device in a low voltage operation mode may reduce a current draw by the memory device or a component thereof (e.g., by performing fewer operations per unit time), which may avoid a further drop in the supply voltage (e.g., by limiting or reducing an IR drop associated with the supply voltage, where the IR drop may refer to a voltage drop associated with an internal resistance of a voltage source for the supply voltage or a voltage drop anywhere in a signal path between the voltage source for the supply voltage and the memory device or the component thereof). The low voltage operation mode thus may avoid the supply voltage from further dropping below the deactivation threshold, which may help avoid deactivation of the memory device. Additionally or alternatively, in some cases, a memory device configured to support a low voltage operation mode based on a low voltage operation threshold may be able to have a lower deactivation threshold relative to other memory devices (e.g., that don't support a low voltage operation mode based on a low voltage operation threshold), which may help avoid deactivation of the memory device. These and other benefits of the teachings herein may be appreciated by one of ordinary skill in the art.

Features of the disclosure are initially described in the context of a system as described with reference to FIG. 1. Features of the disclosure are described in the context state diagrams and a block diagram as described with reference to FIGS. 2-4. These and other features of the disclosure are further illustrated by and described with reference to apparatus diagrams and flowcharts that relate to reduced-voltage operation of a memory device as described with reference to FIGS. 5-8.

FIG. 1 is an example of a system 100 that supports reduced-voltage operation of a memory device in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support reduced-voltage operation of a memory device. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform one or more associated functions as described herein.

One or more components of the memory system 110 may be powered by a voltage source (not shown), where the voltage source or a voltage thereof may be referred to as a supply voltage. For example, the supply voltage may power the memory system controller 115 or any component thereof, the memory device 130 or any component thereof, the memory device 140 or any component thereof, or any combination thereof. Operation of the memory system 110 or a component thereof (e.g. the memory device 130 or the memory device 140) may depend at least in part on how the supply voltage compares to at least a first voltage threshold and a second voltage threshold, which may respectively be referred to as a deactivation threshold and a low voltage operation threshold.

When the supply voltage is above both the deactivation threshold and the low voltage operation threshold, the memory system 110 or component thereof may operate in a normal operation mode. For example, when the memory system 110 or component thereof operates in the normal operation mode, access operations may be concurrently performed in up to a certain quantity of planes 165 within a die 160, or access operations may be concurrently performed across up to a certain quantity of dies 160. When the supply voltage is below the deactivation threshold, the memory system 110 or component thereof may be deactivated (e.g., by the memory system controller 115, by the local control controller 135, by the local controller 145, or by the host system 105 such as in response to an indication from the memory system 110). When the supply voltage is between the deactivation threshold and the low voltage operation threshold, the memory system 110 or component thereof may operate in a low voltage operation mode (e.g., with reduced performance relative to the normal operation mode). For example, when the memory system 110 or component thereof operates in the low voltage operation mode, access operations may be concurrently performed in up to a reduced quantity of planes 165 (e.g., one plane 165) within a die 160, or access operations may be concurrently performed across up to a reduced quantity of dies 160 (e.g., one die 160). Additionally or alternatively, a controller within the memory system 110 may delay the performance of one or more access operations, or the host system 105 may delay the issuance of one or more access commands or a quantity of data associated with one or more access commands, among other possibilities.

Operating the memory system 110 or component thereof in such a low voltage operation mode may avoid exceeding one or more capabilities of the memory system 110 or component thereof when the supply voltage is below low voltage operation threshold (e.g., may avoid errors that could otherwise occur if attempting to perform an excess quantity of concurrent operations while the supply voltage is low). Additionally or alternatively, operating the memory system 110 or component thereof in such a low voltage operation mode may reduce or limit an amount of current drawn by the memory system 110 or component thereof, which may avoid the supply voltage further dropping to be below the deactivation threshold, among other benefits that may be appreciated by one of ordinary skill in the art.

Figure 2:
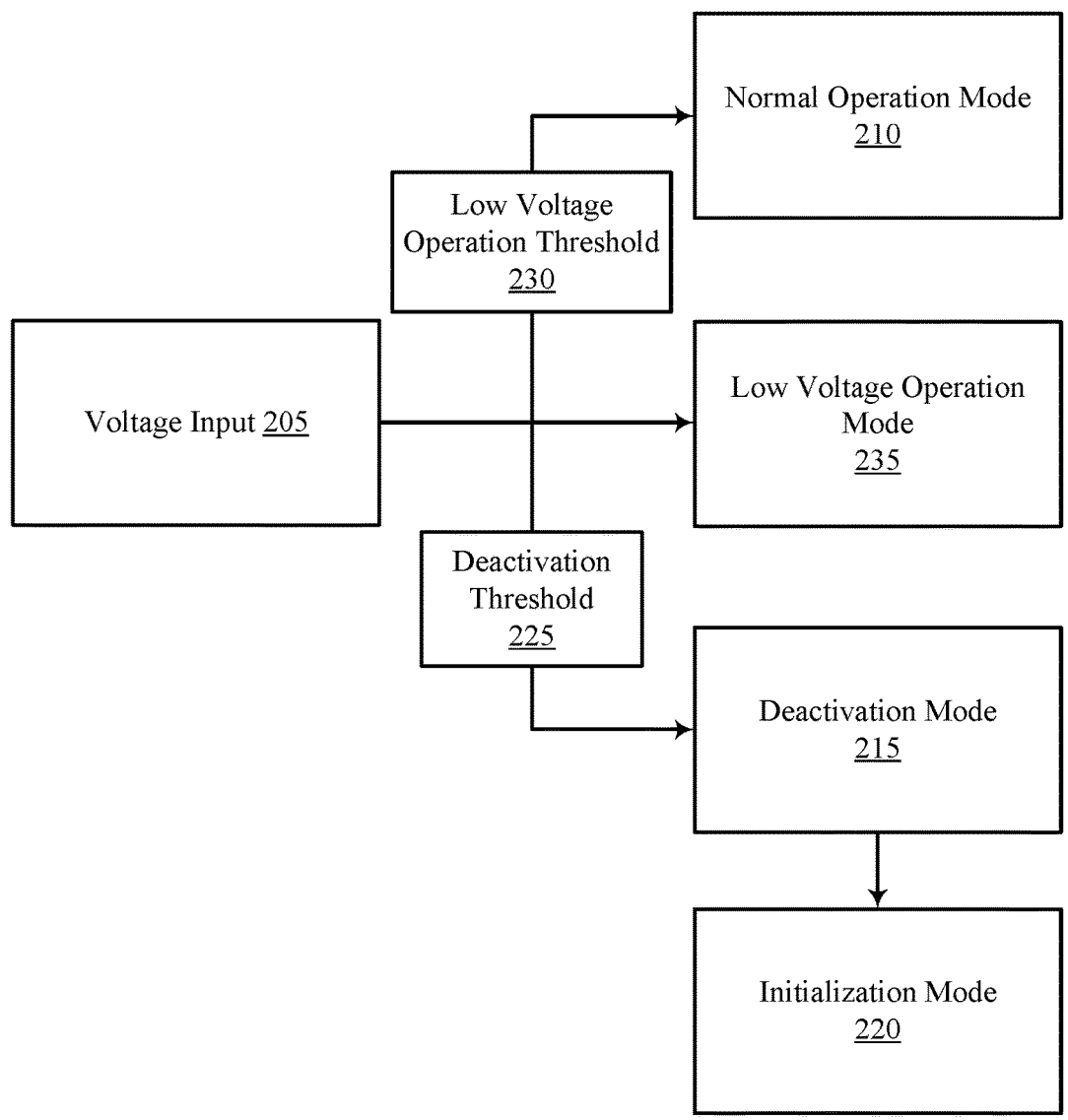
FIGS. 2 and 3 illustrate examples of state diagrams that support reduced-voltage operations of a memory device in accordance with examples as disclosed herein.

FIG. 2 illustrates an example of a state diagram 200 that supports reduced-voltage operation of a memory device in accordance with examples as disclosed herein. The state diagram 200 may illustrate aspects of the operation of a memory device (e.g., a memory system 110, a memory device 130, or a memory device 140 as described with reference to FIG. 1). A controller (e.g., a memory system controller 115, local controller 135, or local controller 145 as described with reference to FIG. 1), a host device (e.g., a host system 105 as described with reference to FIG. 1), or a combination thereof may be configured to manage operation of the memory device in accordance with the state diagram 200.

Voltage input 205 may correspond to (e.g., represent) a value (e.g., voltage, magnitude) of the supply voltage. When the voltage input 205 is above the low voltage operation threshold 230, the memory device may operate in normal operation mode 210. When the memory device is operating in normal operation mode 210, access commands may be received from a host device (e.g., a host system 105 as described with reference to FIG. 1) and may be processed by the memory device at a full capacity (e.g., in terms of bandwidth). Additionally or alternatively, when access commands are received by the memory device for data that spans multiple planes of a memory die or multiple memory dies, memory cells across the multiple planes or the multiple memory dies may be concurrently accessed. Also additionally or alternatively, as described below with reference to FIG. 3, a current limit for the memory device may be set at a first value (e.g., level).

When the voltage input 205 is below the deactivation threshold 225, the memory device may enter (e.g., begin operating in) a deactivation mode 215. Once in the deactivation mode 215, the memory device may be deactivated, powered down, or otherwise uninitialized in a safe way (e.g., in a way to minimize lost data or other adverse performance impacts for the memory device or a broader system that includes the memory device). In some cases, the memory device may be autonomously deactivated (e.g., by a controller within the memory system 110). In other cases, the memory device may indicate to the host device that the voltage input 205 is below the deactivation threshold 225, and the host device may deactivate the memory device (e.g., command that the memory device enter the deactivation mode 215). For example, to indicate to the host device that the voltage input 205 is below the deactivation threshold 225, a controller within the memory system may transmit related signaling (e.g., status flags) to the host device, and in some cases set one or more flags (e.g., bits) within a register (e.g., status register) at the memory device or another memory device within the memory system 110 that may be read by the host device. In some instances, before becoming deactivated, the memory device may indicate (e.g., to the host device or a memory system controller) a last operation or set of operations performed by the memory device.

Accordingly, when the memory device is reactivated, access operations may be resumed based on the last operation or set of operations performed by the memory device.

After being deactivated as a result of entering the deactivation mode 215, either the memory device (e.g., based on monitoring the voltage input 205) or the host device (e.g., based on signaling sent to the memory device) may attempt to reactivate and re-initialize the memory device. Such attempts may fail, however, if the voltage input 205 remains below the deactivation threshold 225 or some other threshold, and thus in some cases additional latency may be introduced by such repeated attempts. Once the voltage input 205 is sufficiently high, the memory device may enter an initialization mode 220 and complete an initialization procedure.

When the voltage input 205 is greater than the deactivation threshold 225 and less than the low voltage operation threshold 230, the memory device may operate in a low voltage operation mode 235. In some cases, when the voltage input 205 drops from above the low voltage operation threshold 230 to below the low voltage operation threshold 230, the memory device may autonomously (e.g., at the direction of a controller within the memory system 110) enter the low voltage operation mode 235. Additionally or alternatively, the memory device may indicate to the host device that the memory device has entered the low voltage operation mode 235. In some cases, the memory device may indicate to the host device that the voltage input 205 has dropped below the low voltage operation threshold 230, and the host device may command that the memory device enter the low voltage operation mode 235.

Figure 3:
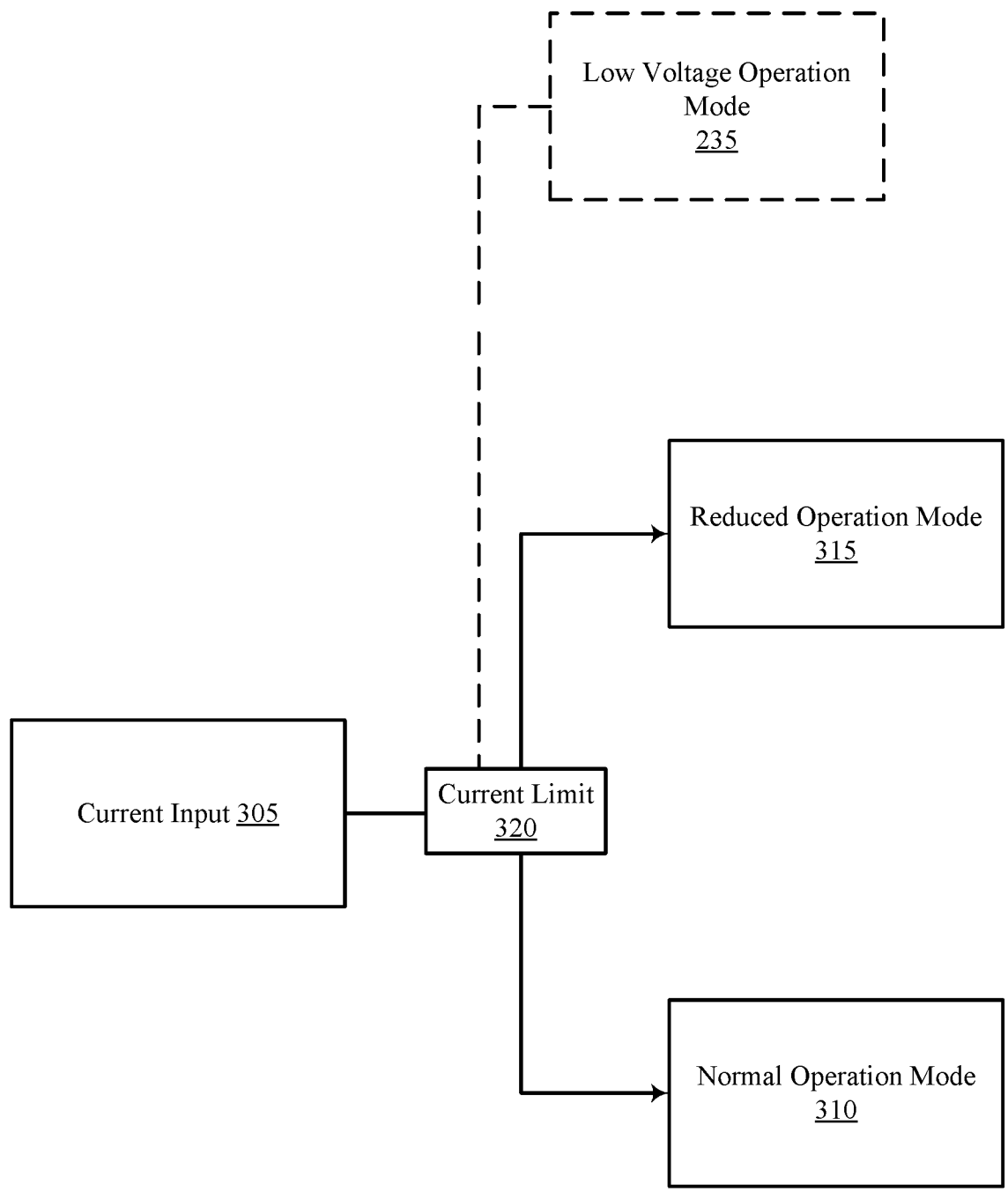

In some cases, operating in the low voltage operation mode 235 may include operating with a reduced current limit or otherwise reduced current draw as described elsewhere herein, including with reference to FIG. 3. Additionally or alternatively, operating in the low voltage operation mode 235 may include switching from supporting concurrent access operations across multiple memory dies or multiple planes of a memory die to supporting access operations within a single memory die or a single plane of a memory die at a time (or otherwise reducing the quantity of dies, planes, or memory cells that may be concurrently accessed). Additionally or alternatively, operating in the low voltage operation mode 235 may include delaying the execution of one or more commanded operations (e.g., access operations), and thus spreading operations out in time. For example, the memory controller may delay executing any one access command for a duration, may wait to execute an access command associated with a first memory die until a second access operation has been performed at a second memory die, or may wait to execute an access command associated with a first plane of a memory die until a second access operation has been performed within a second plane of the same memory die.

And in some cases, the memory device may indicate to the host device that the voltage input 205 has dropped below the low voltage operation threshold 230, and the host device may adjust the subsequent commands it sends to the memory device so as to manage the memory device in accordance with the low voltage operation mode 235 (e.g., without an explicit determination of the low voltage operation mode 235 being made by the memory device, or without an explicit indication of the low voltage operation mode 235 being received by the memory device). For example, the host device may switch from issuing access commands associated with a first quantity of data or a first quantity of planes or dies to issuing access commands associated with a second, lower quantity of data or a second, lower quantity of planes or dies. As another example, the host device may switch from issuing access commands at a first rate (e.g., quantity of access commands per unit time) to issuing access commands at a second rate, or otherwise increasing a delay between successive access commands, and thus spreading operations out in time.

In general, any indication to the host device discussed herein may be executed by the memory device by transmitting related signaling to the host device, setting a value of one or more bits of a register at the memory device or another memory device within the memory system, or any combination thereof.

Operating the memory device in the low voltage operation mode 235 (e.g., remaining activated but at a reduced bandwidth or with otherwise reduced performance) may be an alternative to deactivation, and in some cases may prevent the memory device from shutting down, which may otherwise lead to reactivation delays and/or a need to repeat certain operations associated with the memory device. Additionally or alternatively, operating the memory device in the low voltage operation mode 235 may avoid further decrease in the voltage input 205 (e.g., by reducing or limiting a current draw associated with the memory device), and thus may avoid deactivation.

FIG. 3 illustrates an example of a state diagram 300 that supports reduced-voltage operation of a memory device in accordance with examples as disclosed herein. The state diagram 300 may illustrate aspects of the operation of a memory device (e.g., a memory system 110, a memory device 130, or a memory device 140 as described with reference to FIG. 1). A controller (e.g., a memory system controller 115, local controller 135, or local controller 145 as described with reference to FIG. 1), a host device (e.g., a host system 105 as described with reference to FIG. 1), or a combination thereof may be configured to manage operation of the memory device in accordance with the state diagram 300.

Current input 305 may correspond to (e.g., represent) the value (e.g., magnitude) of a current draw associated with the memory device. For example, current input 305 may represent the magnitude of a current drawn by one or more memory dies or one or more components of a memory die.

A controller for the memory device (e.g., a memory system controller 115, local controller 135, or local controller 145 as described with reference to FIG. 1) may be configured to monitor the current input 305 and maintain the current input 305 as equal to or below the current limit 320. For example, the controller may identify one or more operations to be performed by the memory device (e.g., based on corresponding commands received from the host device). The controller may determine whether performing the one or more operations using a normal operation mode 310 will cause the current input 305 to exceed the current limit 320.

If the controller determines that performing the one or more operations using the normal operation mode 310 will not cause the current input 305 to exceed the current limit 320, then the controller may cause the memory device to perform the one or more operations using the normal operation mode 310. Performing the one or more operations using the normal operation mode 310 may include performing the one or more operations without any added delay between operations or aspects thereof, performing the one or more operations or aspects thereof across an unreduced quantity of memory dies or plane, or any combination thereof, among other examples. In general, performing the one or more operations using the normal operation mode 310 may include performing the one or more operations without any latency or other restriction based on the current limit 320.

If the controller determines that performing the one or more operations using the normal operation mode 310 will cause the current input 305 to exceed the current limit 320, then the controller may cause the memory device to perform the one or more operations using the reduced operation mode 315. Performing the one or more operations using the reduced operation mode 315 may include delaying or staggering the one or more operations or aspects thereof in time so as to avoid causing the current input 305 to cross the current limit 320. For example, the memory device may wait until a first operation at a first memory die (or an aspect thereof) is complete before beginning a second operation at a second memory die, or the memory device may wait until a first operation performed upon memory cells within a first plane of a memory die (or an aspect thereof) is complete before beginning to perform a second operation upon memory cells within a second plane of the memory die. In general, performing the one or more operations using the reduced operation mode 315 may include performing one or more operations with any form of added latency (e.g., delay) or other restriction based on the current limit 320.

In some cases, the current limit 320 may be configurable (e.g., based one or more fuse or anti-fuse settings associated with the memory device). Additional or alternatively, the current limit 320 may be set or adjusted by the host device (e.g., based on setting one or more bits within a mode register or other register of the memory device).

In some cases, when the supply voltage for the memory device is between the low voltage operation threshold and the deactivation threshold for the memory device (e.g., transitions from being above the low voltage operation threshold to being below the low voltage operation threshold), the memory device may switch to a low voltage operation mode as described herein (e.g., a low voltage operation mode 235 as described with reference to FIG. 2). In some cases, switching to a low voltage operation mode 235 may include adjusting (e.g., reducing) the current limit 320. For example, prior to the memory device switching to the low voltage operation mode 235 (e.g., while the memory device is operating in a normal operation mode 210), the current limit 320 may be at a first value (e.g., level, limit), and after the memory device switches to the low voltage operation mode 235, the current limit 320 may be at a second, lower value. The first value may be a default value, for example, and may have been previously set based on one or more fuse or anti-fuse settings associated with the memory device or may have been previously set by the host device.

Thus, in response to the supply voltage crossing a voltage threshold, a current limit 320 for the memory device may be adjusted (e.g., reduced). In some cases, the current limit 320 may be adjusted by an absolute amount (e.g., an absolute mount may be subtracted, or the current limit 320 may be set to a particular new value). In other cases, the current limit 320 may be adjusted by a scaling factor (e.g., reduced by fifty percent). In some cases, the current limit 320 may be based on the value of one or more bits in a register at the memory device or elsewhere within a memory system 110, and adjusting the current limit 320 may include writing (e.g., overwriting) one or more new values to those bits of the register. In some cases, a controller for the memory device may adjust the current limit 320 based on the memory device switching to the low voltage operation mode 235. In such cases, the memory device may or may not indicate the adjustment of the current limit to the host device. In some cases, a host device for the memory device may adjust the current limit 320 (e.g., by sending signaling to the memory device indicating a new value of the current limit 320) based on receiving an indication from the memory device that the supply voltage has dropped below the low voltage operation threshold but remains above the deactivation threshold.

By reducing the current limit 320 and maintaining the current input 305 below the current limit 320, the supply voltage (e.g., the voltage input 205 as described with reference to FIG. 2) may be less likely to drop (e.g., due to IR drop associated with the current draw corresponding to current input 305) below the deactivation threshold, which may prevent the memory device from shutting down and associated reactivation delays or repeated operations, among other benefits that may be appreciated by one of ordinary skill in the art.

Figure 4:
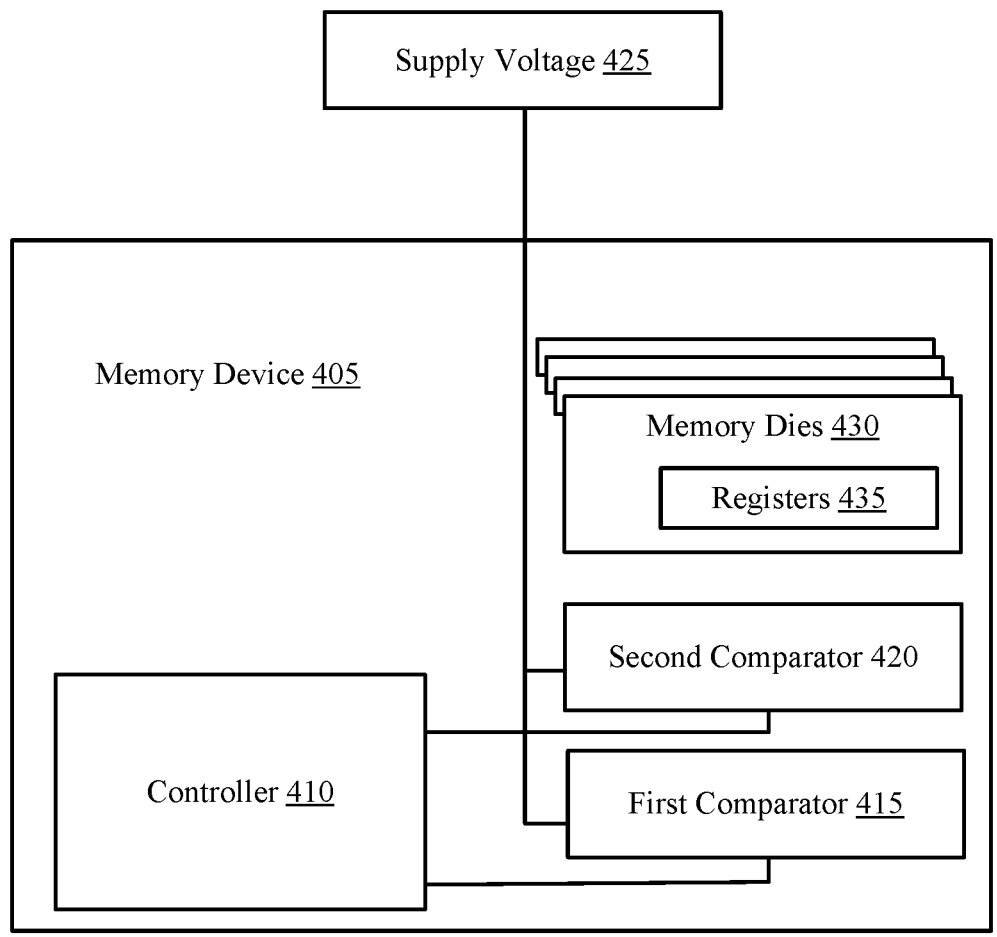
FIGS. 4-6 illustrate examples of block diagrams that support reduced-voltage operations of a memory device in accordance with examples as disclosed herein.

FIG. 4 illustrates an example of block diagram 400 of a memory device 405 that supports reduced-voltage operation of a memory device in accordance with examples as disclosed herein. In some examples, the memory device 405 may include a controller 410, which may be an example of any controller discussed herein (e.g., a memory system controller 115, a local controller 135, or a local controller 145 as described with reference to FIG. 1). The memory device 405 may include a first comparator 415 and a second comparator 420 that are each coupled with a supply voltage 425, which may be an example of a supply voltage as described elsewhere herein (e.g., as corresponding to a voltage input 205 as described with reference to FIG. 2). The memory device 405 may include any quantity of memory dies 430 (e.g., memory dies 160 as described with reference to FIG. 1). One more of the memory dies 430 may include one or more registers 435, which may include any register discussed herein.

In some examples, the first comparator 415 and the second comparator 420 may transmit respective signals to the controller 410 to indicate whether the supply voltage 425 is above or below respective thresholds, so that the controller 410 may adjust switch the memory device 405 into a low voltage operation mode as described herein, transmit a related indication to a host device (not shown) as described herein, or any combination thereof.

In some examples, the first comparator 415 may compare the supply voltage 425 with a first voltage threshold (e.g., a deactivation threshold 225 as described with reference to FIG. 2). If the supply voltage 425 exceeds the deactivation threshold, the first comparator 415 may output signaling to the controller 410 that indicates that the supply voltage 425 exceeds the deactivation threshold. If the supply voltage 425 does not exceed the first voltage threshold, the first comparator 415 may output signaling that indicates the supply voltage 425 does not exceed the deactivation threshold.

In some examples, the second comparator 420 may compare the supply voltage 425 with a second voltage threshold (e.g., a low voltage operation threshold 230 as described with reference to FIG. 2). If the supply voltage 425 exceeds the low voltage operation threshold, the second comparator 420 may output signaling to the controller 410 that indicates that the supply voltage 425 exceeds the low voltage operation threshold. If the supply voltage 425 does not exceed the low voltage operation threshold, the second comparator 420 may output signaling to the controller 410 that indicates that the supply voltage 425 does not exceed the low voltage operation threshold.

The controller 410 thus may determine how the supply voltage 425 compares to the deactivation threshold and low voltage operation threshold based on signals generated by the first comparator 415 and second comparator 420 and may manage the operation of the memory device accordingly as described herein (e.g., in a normal operation mode if the supply voltage 425 exceeds both the deactivation threshold and low voltage operation threshold, and in a low voltage operation mode if the supply voltage 425 is between the deactivation threshold and low voltage operation threshold).

Figure 5:
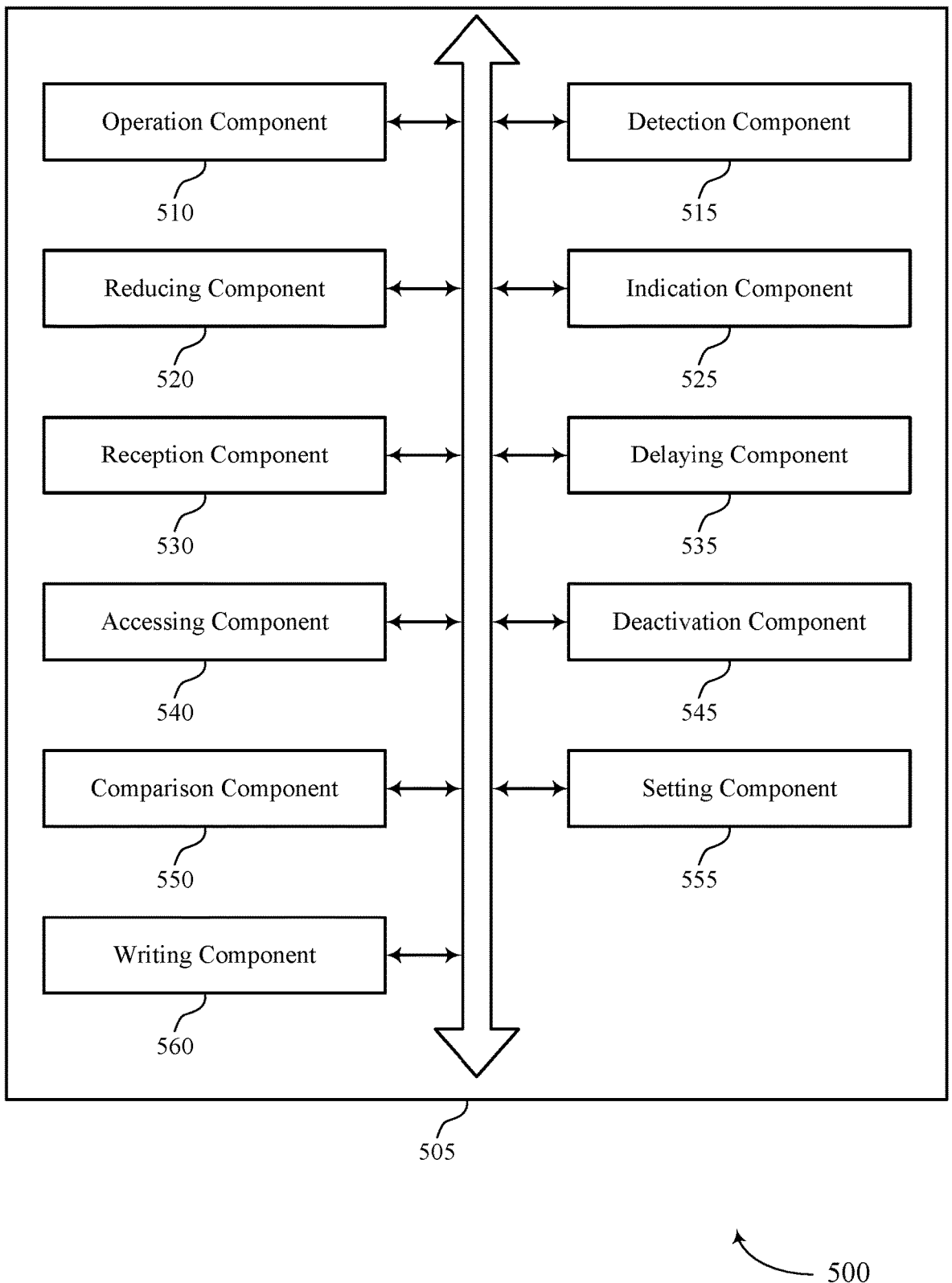

FIG. 5 shows a block diagram 500 of a memory device 505 that supports reduced-voltage operation of a memory device in accordance with examples as disclosed herein. The memory device 505 may be an example of aspects of a memory device as described with reference to FIGS. 2 through 4. The memory device 505 may include an operation component 510, a detection component 515, a reducing component 520, an indication component 525, a reception component 530, a delaying component 535, an accessing component 540, a deactivation component 545, a comparison component 550, a setting component 555, and a writing component 560. Each of these modules may communicate, directly or indirectly, with one another (e.g., via one or more buses).

The operation component 510 may operate a memory device in a first mode based on a supply voltage for the memory device exceeding a first voltage threshold and a second voltage threshold. In some examples, the operation component 510 may operate the memory device in a second mode based on detecting that the supply voltage is between the first voltage threshold and the second voltage threshold, the second mode corresponding to reduced performance of the memory device relative to the first mode. In some examples, the operation component 510 may limit a current draw associated with the memory device.

In some examples, operating the memory device in the second mode includes limiting a current draw associated with the memory device to be below the current limit. In some cases, the memory device supports concurrent access to a first quantity of planes within a memory die while operating in the first mode. In some cases, the memory device supports concurrent access to a second quantity of planes within the memory die while operating in the second mode, the second quantity less than the first quantity.

The detection component 515 may detect, while operating the memory device in the first mode, that the supply voltage is between the first voltage threshold and the second voltage threshold. In some examples, the detection component 515 may detect that the supply voltage is below the first voltage threshold while operating the memory device in the second mode.

The reducing component 520 may reduce a current limit associated with the memory device based on detecting that the supply voltage is between the first voltage threshold and the second voltage threshold, where operating the memory device in the second mode includes limiting the current draw to be below the current limit.

In some cases, the current draw is associated with a set of memory dies within the memory device. In some cases, the current draw is associated with a memory die within the memory device.

The indication component 525 may indicate the reduced current limit to a host device for the memory device. In some examples, the indication component 525 may indicate, to a host device for the memory device, that the supply voltage for the memory device is below the second voltage threshold.

In some cases, the indication to operate the memory device in the second mode includes an indication to reduce a current limit associated with the memory device.

The reception component 530 may receive, while operating the memory device in the second mode, a command to perform an access operation at the memory device, where limiting the current draw for the memory device includes delaying performance of the access operation. In some examples, the reception component 530 may receive, while operating the memory device in the first mode, a first set of one or more access commands for first data from across a set of planes of a memory die.

In some examples, the reception component 530 may receive, while operating the memory device in the second mode, a second set of one or more access commands for second data from across the set of planes of the memory die. In some examples, the reception component 530 may receive, based on the indicating, an indication from the host device to operate the memory device in the second mode, where operating the memory device in the second mode is based on receiving the indication.

The delaying component 535 may delay performance of the access operation includes waiting to perform the access operation at a first memory die of the set of memory dies until a second access operation has been performed at a second memory die of the set of memory dies.

In some examples, delay performance of the access operation includes waiting to perform the access operation within a first plane of the memory die until a second access operation has been performed within a second plane of the memory die.

The accessing component 540 may access, in response to the first set of one or more access commands, a first subset of the first data from a first plane of the set of planes concurrent with accessing a second subset of the first data from a second plane of the set of planes based on operating the memory device in the first mode. In some examples, the accessing component 540 may access, in response to the second set of one or more access commands, a second subset of the second data from the second plane after accessing a first subset of the second data from the first plane based on operating the memory device in the second mode.

The deactivation component 545 may deactivate the memory device based on detecting that the supply voltage is below the first voltage threshold.

The comparison component 550 may compare the supply voltage with the first voltage threshold, where the controller is configured to detect that the supply voltage is above the first voltage threshold based on an output from the first comparator. In some cases, the comparison component 550 may compare the supply voltage with the second voltage threshold, where the controller is configured to detect that the supply voltage is below the second voltage threshold based on an output from the second comparator.

The setting component 555 may set a value of the first voltage threshold, the second voltage threshold, or both based on signaling received from a host device or a set of one or more one-time programmable storage elements coupled with the controller.

The writing component 560 may write an indication of the reduced current limit to a register at the memory device.

Figure 6:
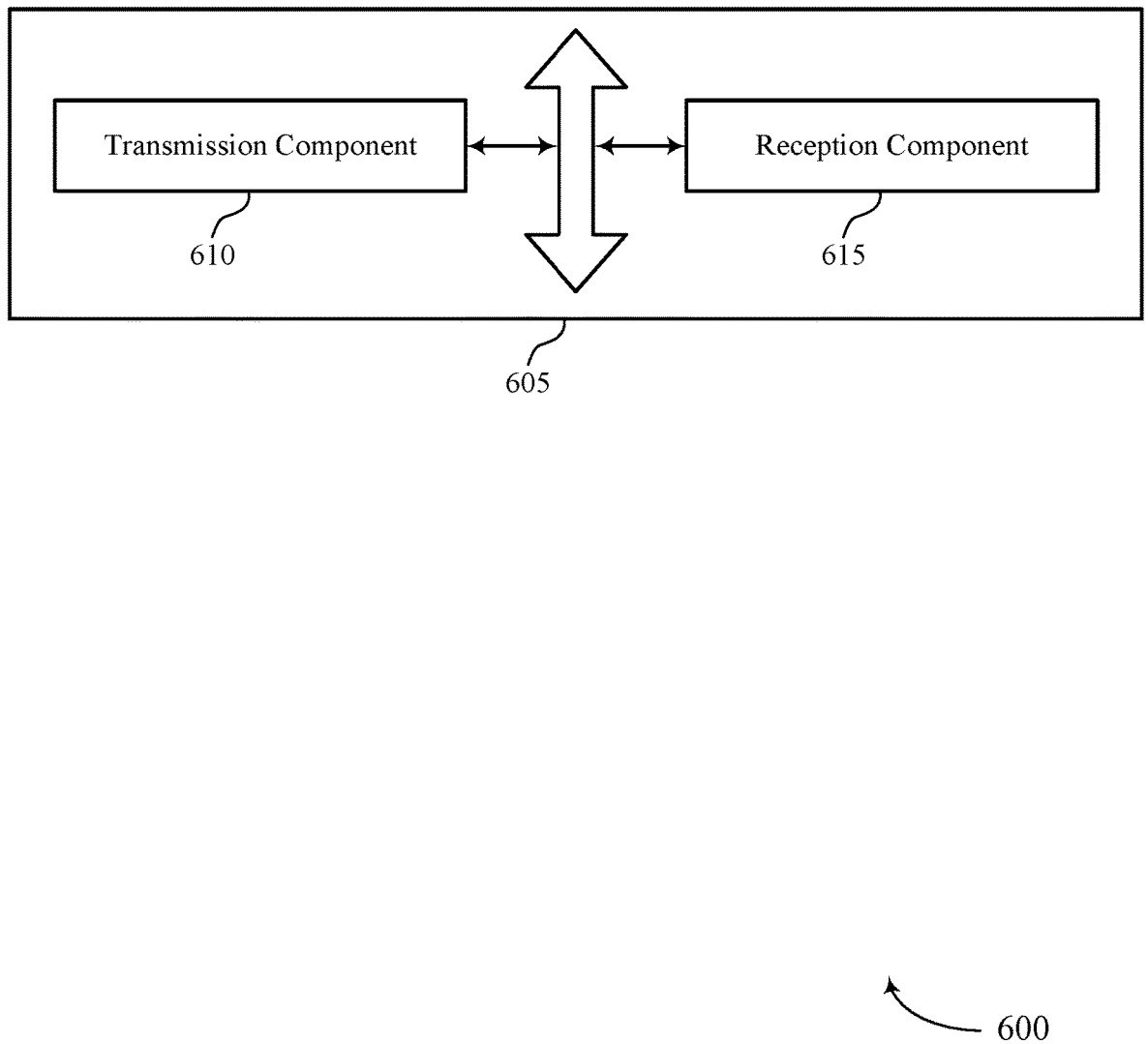

FIG. 6 shows a block diagram 600 of a host device 605 that supports reduced-voltage operation of a memory device in accordance with examples as disclosed herein. The host device 605 may be an example of aspects of a host device as described with reference to FIGS. 2 through 4. The host device 605 may include a transmission component 610 and a reception component 615. Each of these modules may communicate, directly or indirectly, with one another (e.g., via one or more buses).

The transmission component 610 may transmit a set of access commands to a memory device. In some examples, the transmission component 610 may transmit, in response to the indication, signaling to the memory device that is based on the supply voltage for the memory device being between the first voltage threshold and the second voltage threshold. In some examples, the transmission component 610 may transmit, to the memory device, an indication to reduce a current limit associated with the memory device.

In some examples, the transmission component 610 may transmit a first access command to the memory device. In some examples, the transmission component 610 may transmit a second access command to the memory device with a delay relative to the first access command, where the delay is based on the supply voltage for the memory device being between the first voltage threshold and the second voltage threshold.

In some examples, transmitting the signaling includes transmitting a set of access commands that are each for data from a respective plane of the memory die. In some examples, transmit the signaling includes transmitting a set of access commands each corresponding to a second quantity of data that is smaller than the first quantity of data. In some cases, the set of access commands includes one or more access commands each for data from across a set of planes of a memory die. In some cases, the set of access commands includes one or more access commands each corresponding to a first quantity of data.

The reception component 615 may receive, after transmitting the set of access commands, an indication that a supply voltage for the memory device is between a first voltage threshold and a second voltage threshold. In some examples, the reception component 615 may receive, from the memory device, signaling indicating a reduced current limit associated with the memory device.

Figure 7:
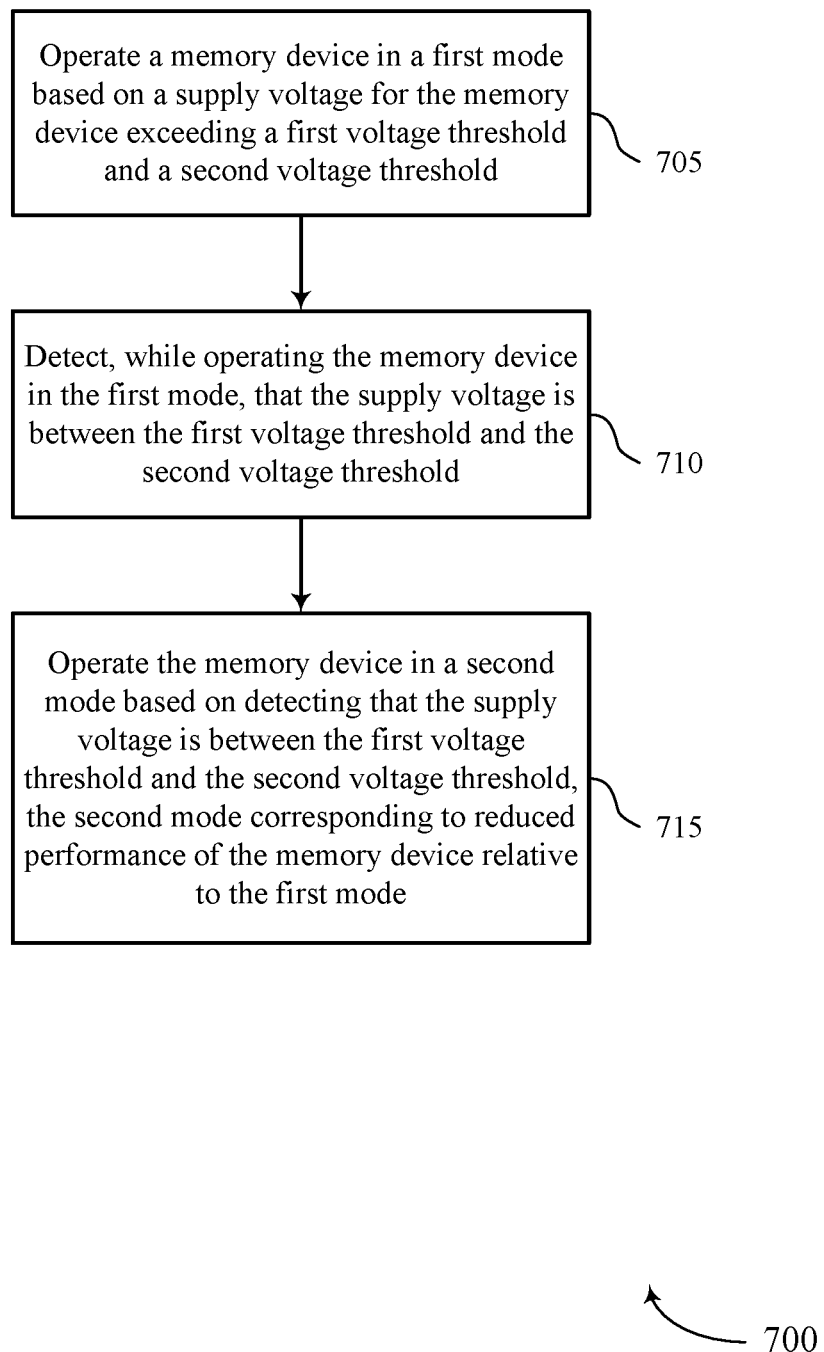
FIGS. 7 and 8 show flowcharts illustrating a method or methods that support reduced-voltage operation of a memory device in accordance with examples as disclosed herein.

FIG. 7 shows a flowchart illustrating a method or methods 700 that supports reduced-voltage operation of a memory device in accordance with aspects of the present disclosure. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

Aspects of the method or methods 700 may be implemented by a controller, among other components. Additionally or alternatively, aspects of method or methods 700 may be implemented as instructions stored in memory (e.g., firmware stored in a memory coupled with a controller 410 as described with reference to FIG. 4). For example, the instructions, when executed by a controller (e.g., the controller 410), may cause the controller to perform the operations of the method or methods 700.

At 705, the memory device may operate in a first mode based on a supply voltage for the memory device exceeding a first voltage threshold and a second voltage threshold. The operations of 705 may be performed according to the methods described herein. In some examples, aspects of the operations of 705 may be performed by an operation component as described with reference to FIG. 5.

At 710, it may be detected, while operating the memory device in the first mode, that the supply voltage is between the first voltage threshold and the second voltage threshold. The operations of 710 may be performed according to the methods described herein. In some examples, aspects of the operations of 710 may be performed by a detection component as described with reference to FIG. 5.

At 715, the memory device may operate in a second mode based on detecting that the supply voltage is between the first voltage threshold and the second voltage threshold, the second mode corresponding to reduced performance of the memory device relative to the first mode. The operations of 715 may be performed according to the methods described herein. In some examples, aspects of the operations of 715 may be performed by an operation component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for operating a memory device in a first mode based on a supply voltage for the memory device exceeding a first voltage threshold and a second voltage threshold, detecting, while operating the memory device in the first mode, that the supply voltage is between the first voltage threshold and the second voltage threshold, and operating the memory device in a second mode based on detecting that the supply voltage is between the first voltage threshold and the second voltage threshold, the second mode corresponding to reduced performance of the memory device relative to the first mode.

In some examples of the method 700 and the apparatus described herein, operations, features, means, or instructions for operating the memory device in the second mode may include operations, features, means, or instructions for limiting a current draw associated with the memory device.

Some examples of the method 700 and the apparatus described herein may further include operations, features, means, or instructions for reducing a current limit associated with the memory device based on detecting that the supply voltage may be between the first voltage threshold and the second voltage threshold, where operating the memory device in the second mode includes limiting the current draw to be below the current limit.

Some examples of the method 700 and the apparatus described herein may further include operations, features, means, or instructions for indicating the reduced current limit to a host device for the memory device. In some examples of the method 700 and the apparatus described herein, operations, features, means, or instructions for indicating the reduced current limit to the host device may include operations, features, means, or instructions for writing an indication of the reduced current limit to a register at the memory device.

Some examples of the method 700 and the apparatus described herein may further include operations, features, means, or instructions for receiving, while operating the memory device in the second mode, a command to perform an access operation at the memory device, where limiting the current draw for the memory device includes delaying performance of the access operation.

In some examples of the method 700 and the apparatus described herein, the current draw may be associated with a set of memory dies within the memory device, and operations, features, means, or instructions for delaying performance of the access operation may include operations, features, means, or instructions for waiting to perform the access operation at a first memory die of the set of memory dies until a second access operation may have been performed at a second memory die of the set of memory dies.

In some examples of the method 700 and the apparatus described herein, the current draw may be associated with a memory die within the memory device, and operations, features, means, or instructions for delaying performance of the access operation may include operations, features, means, or instructions for waiting to perform the access operation within a first plane of the memory die until a second access operation may have been performed within a second plane of the memory die.

In some examples of the method 700 and the apparatus described herein, the memory device supports concurrent access to a first quantity of planes within a memory die while operating in the first mode, and the memory device supports concurrent access to a second quantity of planes within the memory die while operating in the second mode, the second quantity less than the first quantity.

Some examples of the method 700 and the apparatus described herein may further include operations, features, means, or instructions for receiving, while operating the memory device in the first mode, a first set of one or more access commands for first data from across a set of planes of a memory die, accessing, in response to the first set of one or more access commands, a first subset of the first data from a first plane of the set of planes concurrent with accessing a second subset of the first data from a second plane of the set of planes based on operating the memory device in the first mode, receiving, while operating the memory device in the second mode, a second set of one or more access commands for second data from across the set of planes of the memory die, and accessing, in response to the second set of one or more access commands, a second subset of the second data from the second plane after accessing a first subset of the second data from the first plane based on operating the memory device in the second mode.

Some examples of the method 700 and the apparatus described herein may further include operations, features, means, or instructions for indicating, to a host device for the memory device, that the supply voltage for the memory device is below the second voltage threshold, and receiving, based on the indicating, an indication from the host device to operate the memory device in the second mode, where operating the memory device in the second mode may be based on receiving the indication.

In some examples of the method 700 and the apparatus described herein, the indication to operate the memory device in the second mode includes an indication to reduce a current limit associated with the memory device, and operations, features, means, or instructions for operating the memory device in the second mode may include operations, features, means, or instructions for limiting a current draw associated with the memory device to be below the current limit.

Some examples of the method 700 and the apparatus described herein may further include operations, features, means, or instructions for detecting that the supply voltage is below the first voltage threshold while operating the memory device in the second mode, and deactivating the memory device based on detecting that the supply voltage is below the first voltage threshold.

Some examples of the method 700 and the apparatus described herein may further include operations, features, means, or instructions for setting a value of the first voltage threshold, the second voltage threshold, or both based on signaling received from a host device or a set of one or more one-time programmable storage elements coupled with the controller.

In some examples of the method 700 and the apparatus described herein, the memory device includes a first comparator coupled with the supply voltage and the controller and configured to compare the supply voltage with the first voltage threshold, where the controller may be configured to detect that the supply voltage is above the first voltage threshold based on an output from the first comparator, and the memory device includes a second comparator coupled with the supply voltage and the controller and configured to compare the supply voltage with the second voltage threshold, where the controller may be configured to detect that the supply voltage is below the second voltage threshold based on an output from the second comparator.

Figure 8:
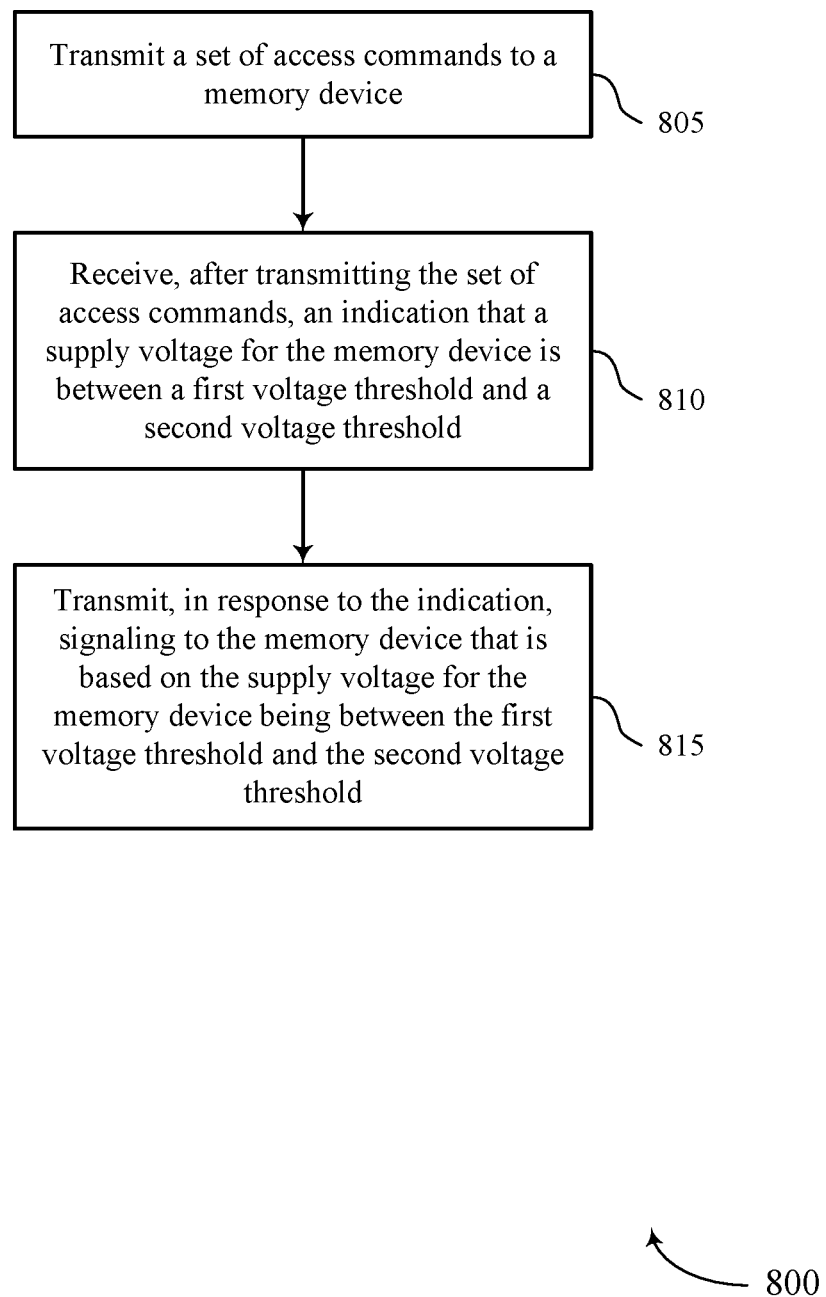

FIG. 8 shows a flowchart illustrating a method or methods 800 that supports reduced-voltage operation of a memory device in accordance with aspects of the present disclosure. The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally or alternatively, a host device may perform aspects of the described functions using special-purpose hardware.

At 805, the host device may transmit a set of access commands to a memory device. The operations of 805 may be performed according to the methods described herein. In some examples, aspects of the operations of 805 may be performed by a transmission component as described with reference to FIG. 6.

At 810, the host device may receive, after transmitting the set of access commands, an indication that a supply voltage for the memory device is between a first voltage threshold and a second voltage threshold. The operations of 810 may be performed according to the methods described herein. In some examples, aspects of the operations of 810 may be performed by a reception component as described with reference to FIG. 6.

At 815, the host device may transmit, in response to the indication, signaling to the memory device that is based on the supply voltage for the memory device being between the first voltage threshold and the second voltage threshold. The operations of 815 may be performed according to the methods described herein. In some examples, aspects of the operations of 815 may be performed by a transmission component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for transmitting a set of access commands to a memory device, receiving, after transmitting the set of access commands, an indication that a supply voltage for the memory device is between a first voltage threshold and a second voltage threshold, and transmitting, in response to the indication, signaling to the memory device that is based on the supply voltage for the memory device being between the first voltage threshold and the second voltage threshold.

In some examples of the method 800 and the apparatus described herein, operations, features, means, or instructions for transmitting the signaling may include operations, features, means, or instructions for transmitting, to the memory device, an indication to reduce a current limit associated with the memory device.

Some examples of the method 800 and the apparatus described herein may further include operations, features, means, or instructions for receiving, from the memory device, signaling indicating a reduced current limit associated with the memory device.

In some examples of the method 800 and the apparatus described herein, the set of access commands includes one or more access commands each for data from across a set of planes of a memory die, and operations, features, means, or instructions for transmitting the signaling may include operations, features, means, or instructions for transmitting a set of access commands that may be each for data from a respective plane of the memory die.

In some examples of the method 800 and the apparatus described herein, operations, features, means, or instructions for transmitting the signaling may include operations, features, means, or instructions for transmitting a first access command to the memory device, and transmitting a second access command to the memory device with a delay relative to the first access command, where the delay may be based on the supply voltage for the memory device being between the first voltage threshold and the second voltage threshold.

In some examples of the method 800 and the apparatus described herein, the set of access commands includes one or more access commands each corresponding to a first quantity of data, and operations, features, means, or instructions for transmitting the signaling may include operations, features, means, or instructions for transmitting a set of access commands each corresponding to a second quantity of data that may be smaller than the first quantity of data.

It should be noted that the methods described above describe possible implementations, and that the operations and the steps may be rearranged or otherwise modified and that other implementations are possible. Further, portions from two or more of the methods may be combined.

An apparatus is described. The apparatus may include a controller configured to operate a memory device in a first mode based on a supply voltage for the memory device exceeding a first voltage threshold and a second voltage threshold, detect, while operating the memory device in the first mode, that the supply voltage is between the first voltage threshold and the second voltage threshold, and operate the memory device in a second mode based on detecting that the supply voltage is between the first voltage threshold and the second voltage threshold, the second mode corresponding to reduced performance of the memory device relative to the first mode.

In some examples, to operate the memory device in the second mode, the controller may be configured to limit a current draw associated with the memory device.

In some examples, the controller may be configured to reduce a current limit associated with the memory device based at least in part on detecting that the supply voltage is between the first voltage threshold and the second voltage threshold, wherein to operate the memory device in the second mode, the controller may be configured to limit the current draw to be below the current limit.

In some examples, the controller may be configured to indicate the reduced current limit to a host device for the memory device.

In some examples, to indicate the reduced current limit to the host device, the controller may be configured to write an indication of the reduced current limit to a register at the memory device.

In some examples, the controller may be configured to receive, while operating the memory device in the second mode, a command to perform an access operation at the memory device, wherein to limit the current draw for the memory device, the controller may be configured to delay performance of the access operation.

In some examples, the current draw may be associated with a plurality of memory dies within the memory device, and, to delay performance of the access operation, the controller may be configured to wait to perform the access operation within a first plane of the memory die until a second access operation has been performed within a second plane of the memory die.

In some examples, the current draw may be associated with a memory die within the memory device, and, to delay performance of the access operation, the controller may be configured to wait to perform the access operation within a first plane of the memory die until a second access operation has been performed within a second plane of the memory die.

In some examples, the memory device supports concurrent access to a first quantity of planes within a memory die while operating in the first mode, and the memory device supports concurrent access to a second quantity of planes within the memory die while operating in the second mode, the second quantity less than the first quantity.

In some examples, the controller may be configured to receive, while operating the memory device in the first mode, a first set of one or more access commands for first data from across a plurality of planes of a memory die, access, in response to the first set of one or more access commands, a first subset of the first data from a first plane of the plurality of planes concurrent with accessing a second subset of the first data from a second plane of the plurality of planes based at least in part on operating the memory device in the first mode, receive, while operating the memory device in the second mode, a second set of one or more access commands for second data from across the plurality of planes of the memory die, and access, in response to the second set of one or more access commands, a second subset of the second data from the second plane after accessing a first subset of the second data from the first plane based at least in part on operating the memory device in the second mode.

In some examples, the controller may be configured to indicate, to a host device for the memory device, that the supply voltage for the memory device is below the second voltage threshold and receive, based at least in part on the indicating, an indication from the host device to operate the memory device in the second mode, wherein operating the memory device in the second mode is based at least in part on receiving the indication.

In some examples, the indication to operate the memory device in the second mode comprises an indication to reduce a current limit associated with the memory device, and, to operate the memory device in the second mode, the controller is configured to limit a current draw associated with the memory device to be below the current limit.

In some examples, the controller may be configured to detect that the supply voltage is below the first voltage threshold while operating the memory device in the second mode and deactivate the memory device based at least in part on detecting that the supply voltage is below the first voltage threshold.

In some examples, the controller may be configured to set a value of the first voltage threshold, the second voltage threshold, or both based at least in part on signaling received from a host device or a set of one or more one-time programmable storage elements coupled with the controller.

In some examples, the apparatus may include a first comparator coupled with the supply voltage and the controller and configured to compare the supply voltage with the first voltage threshold, wherein the controller is configured to detect that the supply voltage is above the first voltage threshold based at least in part on an output from the first comparator, and a second comparator coupled with the supply voltage and the controller and configured to compare the supply voltage with the second voltage threshold, wherein the controller is configured to detect that the supply voltage is below the second voltage threshold based at least in part on an output from the second comparator.

An apparatus is described. The apparatus may be a host device configured to be coupled with a memory device. The apparatus may be configured to transmit a set of access commands to a memory device, receive, after transmitting the set of access commands, an indication that a supply voltage for the memory device is between a first voltage threshold and a second voltage threshold, and transmit, in response to the indication, signaling to the memory device that is based on the supply voltage for the memory device being between the first voltage threshold and the second voltage threshold.

In some examples, to transmit the signaling, the apparatus may be configured to transmit, to the memory device, an indication to reduce a current limit associated with the memory device.

In some examples, the apparatus may be configured to receive, from the memory device, signaling indicating a reduced current limit associated with the memory device.

In some examples, the set of access commands includes one or more access commands each for data from across a set of planes of a memory die and, to transmit the signaling, the apparatus may be configured to transmit a set of access commands that may be each for data from a respective plane of the memory die.

In some examples, to transmit the signaling, the apparatus may be configured to transmit a first access command to the memory device, and transmit a second access command to the memory device with a delay relative to the first access command, where the delay may be based on the supply voltage for the memory device being between the first voltage threshold and the second voltage threshold.

In some examples, the set of access commands includes one or more access commands each corresponding to a first quantity of data and, to transmit the signaling, the apparatus may be configured to transmit a set of access commands each corresponding to a second quantity of data that may be smaller than the first quantity of data.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a memory device; and
    a controller within the memory device and configured to cause the apparatus to:
        operate the memory device in a first mode based at least in part on a supply voltage for the memory device exceeding a first voltage threshold and a second voltage threshold;
        detect, while operating the memory device in the first mode, that the supply voltage is between the first voltage threshold and the second voltage threshold; and
        operate the memory device in a second mode based at least in part on detecting that the supply voltage is between the first voltage threshold and the second voltage threshold, the second mode corresponding to reduced performance of the memory device relative to the first mode.

2. The apparatus of claim 1, wherein, to operate the memory device in the second mode, the controller is configured to cause the apparatus to:
    limit a current draw associated with the memory device.

3. The apparatus of claim 2, wherein the controller is further configured to cause the apparatus to:

reduce a current limit associated with the memory device based at least in part on detecting that the supply voltage is between the first voltage threshold and the second voltage threshold, wherein:
to operate the memory device in the second mode, the controller is configured to cause the apparatus to limit the current draw to be below the current limit.

4. The apparatus of claim 3, wherein the controller is further configured to:
indicate the reduced current limit to a host device for the memory device.

5. The apparatus of claim 4, wherein, to indicate the reduced current limit to the host device, the controller is configured to cause the apparatus to:
write an indication of the reduced current limit to a register at the memory device.

6. The apparatus of claim 2, wherein the controller is further configured to cause the apparatus to:
receive, while operating the memory device in the second mode, a command to perform an access operation at the memory device, wherein:
to limit the current draw for the memory device, the controller is configured to cause the apparatus to delay performance of the access operation.

7. The apparatus of claim 6, wherein:
the current draw is associated with a plurality of memory dies within the memory device; and
to delay performance of the access operation, the controller is configured to cause the apparatus to wait to perform the access operation at a first memory die of the plurality of memory dies until a second access operation has been performed at a second memory die of the plurality of memory dies.

8. The apparatus of claim 6, wherein:
the current draw is associated with a memory die within the memory device; and
to delay performance of the access operation, the controller is configured to cause the apparatus to wait to perform the access operation within a first plane of the memory die until a second access operation has been performed within a second plane of the memory die.

9. The apparatus of claim 1, wherein:
the memory device supports concurrent access to a first quantity of planes within a memory die while operating in the first mode; and
the memory device supports concurrent access to a second quantity of planes within the memory die while operating in the second mode, the second quantity less than the first quantity.

10. The apparatus of claim 1, wherein the controller is further configured to cause the apparatus to:
receive, while operating the memory device in the first mode, a first set of one or more access commands for first data from across a plurality of planes of a memory die; and
access, in response to the first set of one or more access commands, a first subset of the first data from a first plane of the plurality of planes concurrent with accessing a second subset of the first data from a second plane of the plurality of planes based at least in part on operating the memory device in the first mode;
receive, while operating the memory device in the second mode, a second set of one or more access commands for second data from across the plurality of planes of the memory die; and
access, in response to the second set of one or more access commands, a second subset of the second data from the second plane after accessing a first subset of the second data from the first plane based at least in part on operating the memory device in the second mode.

11. The apparatus of claim 1, wherein the controller is further configured to cause the apparatus to:
indicate, to a host device for the memory device, that the supply voltage for the memory device is below the second voltage threshold; and
receive, based at least in part on the indicating, an indication from the host device to operate the memory device in the second mode, wherein operating the memory device in the second mode is based at least in part on receiving the indication.

12. The apparatus of claim 11, wherein:
the indication to operate the memory device in the second mode comprises an indication to reduce a current limit associated with the memory device; and
to operate the memory device in the second mode, the controller is configured to cause the apparatus to limit a current draw associated with the memory device to be below the current limit.

13. The apparatus of claim 1, wherein the controller is further configured to cause the apparatus to:
detect that the supply voltage is below the first voltage threshold while operating the memory device in the second mode; and
deactivate the memory device based at least in part on detecting that the supply voltage is below the first voltage threshold.

14. The apparatus of claim 1, wherein the controller is further configured to cause the apparatus to:
set a value of the first voltage threshold, the second voltage threshold, or both based at least in part on signaling received from a host device or a set of one or more one-time programmable storage elements coupled with the controller.

15. The apparatus of claim 1, further comprising:
a first comparator coupled with the supply voltage and the controller and configured to compare the supply voltage with the first voltage threshold, wherein the controller is configured to cause the apparatus to detect that the supply voltage is above the first voltage threshold based at least in part on an output from the first comparator; and
a second comparator coupled with the supply voltage and the controller and configured to compare the supply voltage with the second voltage threshold, wherein the controller is configured to cause the apparatus to detect that the supply voltage is below the second voltage threshold based at least in part on an output from the second comparator.

16. An apparatus, comprising:
a host device configured to be coupled with a memory device, wherein the host device is configured to:
transmit a plurality of access commands to the memory device;
receive, after transmitting the plurality of access commands, an indication that a supply voltage for the memory device is between a first voltage threshold and a second voltage threshold; and
transmit, in response to the indication, signaling to the memory device that is based at least in part on the supply voltage for the memory device being between the first voltage threshold and the second voltage threshold.

17. The apparatus of claim 16, wherein, to transmit the signaling, the host device is configured to:

transmit, to the memory device, an indication to reduce a current limit associated with the memory device.

18. The apparatus of claim 16, wherein the host device is further configured to:
receive, from the memory device, signaling indicating a reduced current limit associated with the memory device.

19. The apparatus of claim 16, wherein:
the plurality of access commands comprises one or more access commands each for data from across a plurality of planes of a memory die; and
to transmit the signaling, the host device is configured to transmit a set of access commands that are each for data from a respective plane of the memory die.

20. The apparatus of claim 16, wherein, to transmit the signaling, the host device is configured to:
transmit a first access command to the memory device; and
transmit a second access command to the memory device with a delay relative to the first access command, wherein the delay is based at least in part on the supply voltage for the memory device being between the first voltage threshold and the second voltage threshold.

21. The apparatus of claim 16, wherein:
the plurality of access commands comprises one or more access commands each corresponding to a first quantity of data; and
to transmit the signaling, the host device is configured to transmit a set of access commands each corresponding to a second quantity of data that is smaller than the first quantity of data.

22. A non-transitory computer-readable medium storing code comprising instructions which, when executed by a processor of an electronic device, cause the electronic device to:
operate a memory device in a first mode based at least in part on a supply voltage for the memory device exceeding a first voltage threshold and a second voltage threshold;
detect, while operating the memory device in the first mode, that the supply voltage is between the first voltage threshold and the second voltage threshold; and
operate the memory device in a second mode based at least in part on detecting that the supply voltage is between the first voltage threshold and the second voltage threshold, the second mode corresponding to reduced performance of the memory device relative to the first mode.

23. The non-transitory computer-readable medium of claim 22, wherein the instructions to operate the memory device in the second mode, when executed by the processor of the electronic device, cause the electronic device to:
limit a current draw associated with the memory device.

24. The non-transitory computer-readable medium of claim 22, wherein:
the instructions to operate the memory device in the first mode, when executed by the processor of the electronic device, cause the electronic device to support concurrent access to a first quantity of planes within a memory die of the memory device; and
the instructions to operate the memory device in the second mode, when executed by the processor of the electronic device, cause the electronic device to support concurrent access to a second quantity of planes within the memory die, the second quantity less than the first quantity.

25. The non-transitory computer-readable medium of claim 22, wherein the instructions, when executed by the processor of the electronic device, further cause the electronic device to:
indicate, to a host device for the memory device, that the supply voltage for the memory device is below the second voltage threshold;
receive, based at least in part on the indicating, an indication from the host device to operate the memory device in the second mode; and
operate the memory device in the second mode based at least in part on receiving the indication.

\* \* \* \* \*